(12) United States Patent
Song et al.

(10) Patent No.: US 11,631,662 B2
(45) Date of Patent: Apr. 18, 2023

(54) SYSTEM ON CHIP

(71) Applicant: SHENZHEN WINSEMI MICROELECTRONICS CO., LTD, Shenzhen (CN)

(72) Inventors: Lijun Song, Shenzhen (CN); Pengliang Song, Shenzhen (CN); Yaya Mu, Shenzhen (CN); Xi Dang, Shenzhen (CN)

(73) Assignee: SHENZHEN WINSEMI MICROELECTRONICS CO., LTD, Shenzhen (CN)

( * ) Notice: Subject to any disclaimer, the term of this patent is extended or adjusted under 35 U.S.C. 154(b) by 358 days.

(21) Appl. No.: 17/005,427

(22) Filed: Aug. 28, 2020

(65) Prior Publication Data
US 2021/0104511 A1  Apr. 8, 2021

(30) Foreign Application Priority Data
Oct. 8, 2019 (CN) .......................... 201910950469.4

(51) Int. Cl.
*H01L 27/02* (2006.01)
*G06F 15/78* (2006.01)
*H01L 29/06* (2006.01)

(52) U.S. Cl.
CPC ...... *H01L 27/0248* (2013.01); *G06F 15/7807* (2013.01); *H01L 27/0255* (2013.01); *H01L 27/0266* (2013.01); *H01L 29/0611* (2013.01)

(58) Field of Classification Search
CPC ............ H01L 27/0255; H01L 27/0248; H01L 27/0266; H01L 29/0611; G05F 1/56; G06F 15/7807
See application file for complete search history.

(56) References Cited

U.S. PATENT DOCUMENTS

| | | | | |
|---|---|---|---|---|
| 9,438,032 B2* | 9/2016 | Iwamizu | ................ | H02H 7/205 |
| 11,088,553 B2* | 8/2021 | Fu | ........................ | H02J 7/0029 |
| 11,462,463 B2* | 10/2022 | Elsherbini | ............... | H01L 24/02 |
| 2022/0006374 A1* | 1/2022 | Warnes | ................ | H02M 3/158 |

* cited by examiner

*Primary Examiner* — Eduardo A Rodela
(74) *Attorney, Agent, or Firm* — IPro, PLLC; Na Xu

(57) ABSTRACT

The present invention discloses a System on Chip, which includes a power supply pin, a ground pin, an anti-static unit and an anti-reverse connection unit, wherein the anti-static unit is connected between the power supply pin and the ground pin through the anti-reverse connection unit, the power supply pin and the ground pin of the System on Chip are connected to an external power supply; wherein, when the System on Chip is in normal operation, the anti-static unit performs ESD protection of the power supply pin through the conducted anti-static unit; whereas when the external power supply is reversely connected between the power supply pin and the ground pin of the System on Chip, the anti-reverse connection unit is cut off to prevent the reversely connected external power supply from directly connecting anode with cathode of the external power supply through the anti-static unit.

9 Claims, 10 Drawing Sheets

SYSTEM ON CHIP

CROSS REFERENCE TO RELATED APPLICATIONS

The present application claims the benefit of Chinese patent application No. 2019109504694 filed on Oct. 8, 2019, which is hereby incorporated by reference herein in its entirety.

FIELD OF THE INVENTION

The present invention relates to the technical field of electronic devices, in particular to a System on Chip.

BACKGROUND OF THE INVENTION

System on Chip (SOC) is a commonly used technology in the field of integrated circuits. It aims to combine multiple integrated circuits with specific functions on one chip to form a system or a product, which includes the completed hardware system and the embedded software that is loaded thereto. SOC has obvious advantages in various aspects including performance, cost, power consumption, reliability, life cycle and scope of use.

However, the SOC may also have security problems, such as static electricity in the circuit or reverse connection of the external power supply. The static electricity in the circuit is generated rapidly with high intensity, up to several thousand volts. Enough heat can be generated in a very short time to melt the internal circuit of the SOC, causing irreversible damage. When the external power supply is reversely connected in a wrong way, the SOC may internally form a circuit with no current limiting devices, and excessive current will burn down the SOC and the external power supply.

SUMMARY OF THE INVENTION

The present invention provides a SOC to solve the problem that SOC in the prior art may easily get burnt.

In order to solve the above technical problem, the present invention provides a SOC, which includes a power supply pin, a ground pin, an anti-static unit and an anti-reverse connection unit, wherein the anti-static unit is connected between the power supply pin and the ground pin through the anti-reverse connection unit, and the power supply pin and the ground pin of the SOC are connected to an external power supply; wherein, when the SOC is in normal operation, the anti-static unit performs ESD protection of the power supply pin through the conducted anti-static unit; whereas when the external power supply is reversely connected between the power supply pin and the ground pin of the SOC, the anti-reverse connection unit is cut off to prevent the reversely connected external power supply from directly connecting the anode with the cathode of the external power supply through the anti-static unit.

Optionally, the anti-reverse connection unit includes a first field effect transistor, which includes a gate, a first source and drain, a second source and drain, and a base, wherein the first source and drain of the first field effect transistor is connected to the power supply pin as the input terminal of the anti-reverse connection unit, and the second source and drain of the first field effect transistor is connected to the anti-static unit as the output terminal of the anti-reverse connection unit, and the gate of the first field effect transistor is selectively connected to the power supply pin or the ground pin to conduct the first field effect transistor when the SOC is in normal operation; wherein the base of the first field effect transistor is floating connected, so that the PN junction is used to form a first diode between the first source and drain and the base of the first field effect transistor, and to form a second diode between the second source and drain and the base of the first field effect transistor, the first diode being opposite to the second diode, so that the anti-reverse connection unit is cut off to prevent the reversely connected external power supply from directly connecting the anode with the cathode of the external power supply through the anti-static unit when the external power supply is reversely connected between the power supply pin and the ground pin of the SOC.

Optionally, the first field effect transistor is a P-type transistor, wherein the gate of the P-type transistor is connected to the ground pin to conduct the P-type transistor when the SOC is in normal operation; and the anode of the first diode is the first source and drain of the P-type transistor, the cathode of the first diode is the base of the P-type transistor; the anode of the second diode is the second source and drain of the P-type transistor, and the cathode of the second diode is the base of the P-type transistor.

Optionally, the SOC further includes: a P-type substrate; an N-type well region formed in the P-type substrate; a first P-type source and drain region formed in the N-type well region; a second P-type source and drain region formed in the N-type well region; an N-type heavily doped region formed in the N-type well region; a first insulating layer arranged on the substrate; wherein, the first source and drain is arranged on the first P-type source and drain region, the second source and drain is arranged on the second P-type source and drain region, and the gate is arranged on the insulating layer and located between the first P-type source and drain region and the second P-type source and drain region, and the base is arranged on the N-type heavily doped region; the first source and drain, serving as the input terminal of the anti-reverse connection unit, is connected to the power supply pin; the gate is connected to the ground pin; and the second source and drain, serving as the output terminal of the anti-reverse connection unit, is connected to the anti-static unit.

Optionally, the first field effect transistor is an N-type transistor, wherein the gate of the N-type transistor is connected to the power supply pin to conduct the N-type transistor when the SOC is in normal operation; and the anode of the first diode is the base of the N-type transistor; the cathode of the first diode is the first source and drain of the N-type transistor; the anode of the second diode is the base of the N-type transistor, and the cathode of the second diode is the second source and drain of the N-type transistor.

Optionally, the SOC further includes: a P-type substrate; a P-type well region formed in the P-type substrate; a first N-type source and drain region formed in the P-type well region; a second N-type source and drain region formed in the P-type well region; a P-type heavily doped region formed in the P-type well region; a first insulating layer arranged on the substrate; wherein, the first source and drain is arranged on the first N-type source and drain region, the second source and drain is arranged on the second N-type source and drain region, and the gate is arranged on the insulating layer and located between the first N-type source and drain region and the second N-type source and drain region, and the base is arranged on the P-type heavily doped region; the first source and drain, serving as the input terminal of the anti-reverse connection unit, is connected to the power supply pin; the gate is connected to the power supply pin; and the second source and drain, serving as the output terminal of the anti-reverse connection unit, is connected to the anti-static unit.

Optionally, the anti-static unit includes: a second N-type field effect transistor which includes a gate, a first source and drain, a second source and drain, and a base, wherein the gate and the second source and drain of the second N-type field effect transistor are connected to the ground pin, the second source and drain and the base are connected, the first source and drain is connected to the output terminal of the anti-static unit and, by use of the PN junction, the second N-type field effect transistor forms a reversed third diode between the first source and drain and the base; wherein, when the power supply pin of the SOC receives the electrostatic voltage, the electrostatic voltage breaks down the reversed third diode of the second N-type field effect transistor through the conducted anti-static unit, to perform ESD protection of the power supply pin.

Optionally, the SOC further includes: a P-type substrate; a P-type well region formed in the P-type substrate; a first N-type source and drain region formed in the P-type well region; a second N-type source and drain region formed in the P-type well region; a P-type heavily doped region formed in the P-type well region; a first insulating layer arranged on the substrate; wherein, the first source and drain of the second N-type field effect transistor is arranged on the first N-type source and drain region to serve as the input terminal of the anti-static unit to be connected to the output terminal of the anti-reverse connection unit, and the second source and drain of the second N-type field effect transistor is arranged on the second N-type source and drain region; the gate of the second N-type field effect transistor is arranged on the first insulating layer and located between the first N-type source and drain region and the second N-type source and drain region, and the base of the second N-type field effect transistor is arranged on the P-type heavily doped region; wherein the gate, the second N-type source and drain and the base of the second N-type field effect transistor are respectively connected to the ground pin.

Optionally, the SOC further includes a filter capacitor, wherein one end is connected to the output terminal of the anti-reverse connection unit, and the other end is connected to the ground pin.

Optionally, the external power supply is a battery.

The present invention discloses a SOC, which includes a power supply pin, a ground pin, an anti-static unit and an anti-reverse connection unit, wherein the anti-static unit is connected between the power supply pin and the ground pin through the anti-reverse connection unit, and the power supply pin and the ground pin of the SOC are connected to an external power supply; wherein, when the SOC is in normal operation, the anti-static unit performs ESD protection of the power supply pin through the conducted anti-static unit; whereas when the external power supply is reversely connected between the power supply pin and the ground pin of the SOC, the anti-reverse connection unit is cut off to prevent the reversely connected external power supply from directly connecting the anode with the cathode of the external power supply through the anti-static unit. The SOC of the present invention is provided with an anti-static unit and an anti-reverse connection unit, which can effectively conduct the static electricity on the power supply pin of the SOC and can cut off current when the power supply is reversely connected, thus protecting the SOC and the power supply from getting burned.

BRIEF DESCRIPTION OF THE DRAWINGS

In order to illustrate more clearly the technical solutions in the embodiments of the present invention, hereinbelow are brief introductions of the drawings that need to be used in describing the embodiments. Obviously, the drawings as described below are only some embodiments of the present invention. For persons skilled in the art, they can obtain other drawings according to the drawings provided without creative effort.

FIG. 3 is a schematic structure diagram that the circuit diagram of the SOC of FIG. 2 corresponds to;

FIG. 5 is a schematic structure diagram that the circuit diagram of the SOC of FIG. 4 corresponds to;

FIG. 7 is a schematic structure diagram that the SOC of FIG. 6 corresponds to;

FIG. 9 is a schematic structure diagram that the SOC of FIG. 8 corresponds to;

DETAILED DESCRIPTION OF THE EMBODIMENTS

In order that those skilled in the art can better understand the technical solutions of the present invention, a SOC as provided by the present invention will be further described in detail below in combination with the drawings and specific embodiments.

Figure 1:
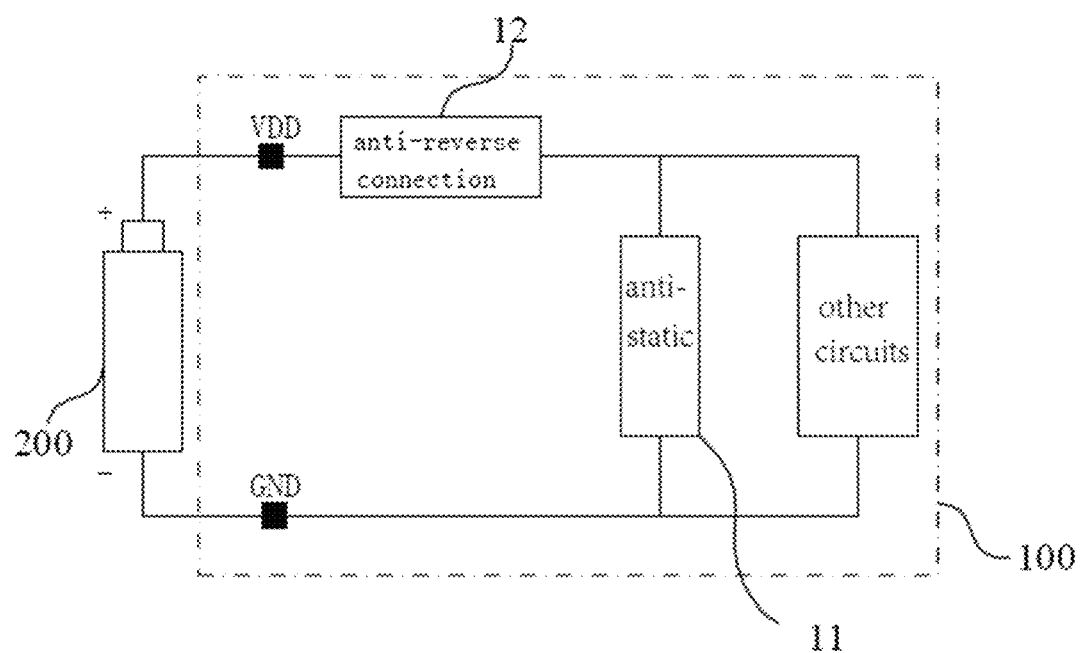
FIG. 1 is a schematic circuit diagram of an embodiment of the SOC of the present invention.

The present invention provides a SOC. Please refer to FIG. 1. FIG. 1 is a schematic circuit diagram of an embodiment of the SOC of the present invention. SOC 100 includes a power supply pin VDD, a ground pin GND, an anti-static unit 11, an anti-reverse connection unit 12 and other circuits.

The anti-static unit 11 and the anti-reverse connection unit 12 form a protection unit, which protection unit can realize the protection of the SOC 100, preventing the SOC 100 from getting burned by excessive current. Other circuits in the SOC 100 may include other functional circuits, such as control circuits, communication circuits, display circuits, and the like. The SOC 100 with functional circuits may perform corresponding functions. There is no limit for the functional circuits in the SOC 100 of the present invention. Those skilled in the art may set other circuits in the SOC as needed.

The input terminal of the anti-reverse connection unit 12 is connected to the power supply pin VDD, the output terminal of the anti-reverse connection unit 12 is connected to the input terminal of the anti-static unit 11, and the output terminal of the anti-static unit 11 is connected to the power supply pin GND. The anti-static unit 11 is connected between the power supply pin VDD and the ground pin GND through the anti-reverse connection unit 12, and the power supply pin VDD and the ground pin GND of the SOC 100 are connected to the external power supply 200.

When the SOC 100 is in normal operation, the anti-static unit 11 can perform ESD protection of the power supply pin VDD through the conducted anti-static unit 11. The anti-static unit 11 can release the static electricity in the power supply pin VDD to the ground pin GND.

When the external power supply 200 is reversely connected between the power supply pin VDD and the ground pin GND of the SOC 100, that is, when the anode of the external power supply 200 is connected to the ground pin GND of the SOC 100 and the cathode of the external power supply 200 is connected to the power supply pin VDD of the SOC 100, the anti-reverse connection unit 12 can cut off the current of the SOC 100 to prevent the reversely connected external power supply 200 from directly connecting the anode with the cathode of the external power supply 200 through the anti-static unit 11 and other circuits of the SOC 100, which will generate a large current to burn down the SOC 100 and the external power supply 200.

In this embodiment, the external power supply 200 can be various kinds of batteries, such as storage batteries, dry batteries, lithium batteries, etc.

In this embodiment, the chips on the SOC include a power supply pin, a ground pin, an anti-static unit and an anti-reverse connection unit, wherein the anti-static unit is connected between the power supply pin and the ground pin through the anti-reverse connection unit, and the power supply pin and the ground pin of the SOC are connected to an external power supply. When the SOC is in normal operation, the anti-static unit performs ESD protection of the power supply pin through the conducted anti-static unit; whereas when the external power supply is reversely connected between the power supply pin and the ground pin of the SOC, the anti-reverse connection unit is cut off to prevent the reversely connected external power supply from connecting anode with cathode of the external power supply through the anti-static unit. The SOC of the present invention can effectively conduct the static electricity on the power supply pin of the SOC and cut off current when the power supply is reversely connected, thus protecting the SOC and the power supply from getting burned.

Figure 2:
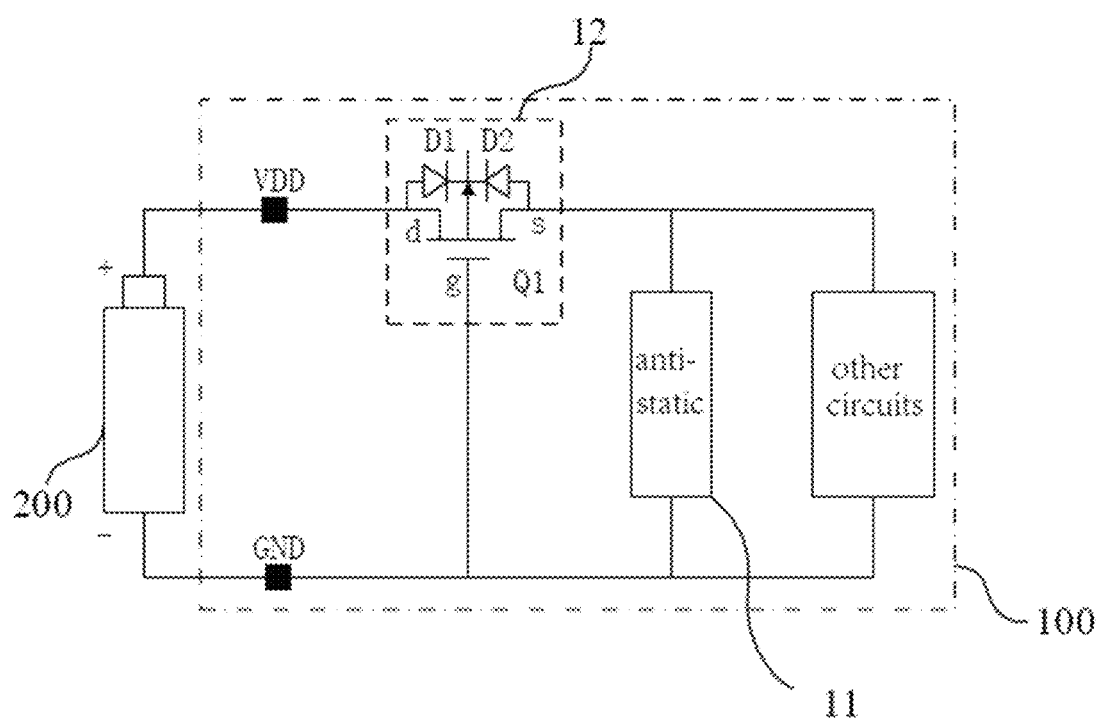
FIG. 2 is a schematic circuit diagram of another embodiment of the SOC of the present invention.

Please refer to FIG. 2, which is a schematic circuit diagram of another embodiment of the SOC of the present invention. The anti-reverse connection unit 12 may include a first field effect transistor Q1, which first field effect transistor Q1 can be a P-type transistor Q1. The P-type transistor Q1 may include a gate g, a first source and drain d, a second source and drain s, and a base b. Among them, the first source and drain d of the P-type transistor Q1 is connected to the power supply pin VDD as the input terminal of the anti-reverse connection unit 12, the second source and drain s of the P-type transistor Q1 is connected to the anti-static unit 11 as the output terminal of anti-reverse connection unit 12, whereas the gate g of the P-type transistor Q1 can be connected to the ground pin GND to conduct the P-type transistor Q1 when the SOC 100 is in normal operation.

The base b of the P-type transistor Q1 is floating connected, so that the PN junction is used to form a first diode D1 between the first source and drain d and the base b of the P-type transistor Q1, and to form a second diode D2 between the second source and drain s and the base b of the P-type transistor Q1, wherein the first diode D1 is arranged opposite to the second diode D2.

Specifically, the anode of the first diode D1 can be the first source and drain d of the P-type transistor Q1, the cathode of the first diode D1 can be the base b of the P-type transistor Q1, the anode of the second diode D2 can be the second source and drain s of the P-type transistor Q1, and the cathode of the second diode D2 can be the base b of the P-type transistor Q1.

When the external power supply 200 is reversely connected between the power supply pin VDD and the ground pin GND of the SOC 100, the P-type transistor Q1 cannot work normally, and the current can be cut off by the first diode D1 after it flows through the second diode D2, so as to prevent the external power supply 200 that is reversely connected from directly connecting the anode with the cathode of the external power supply 200 through the anti-static unit 11.

Figure 3:
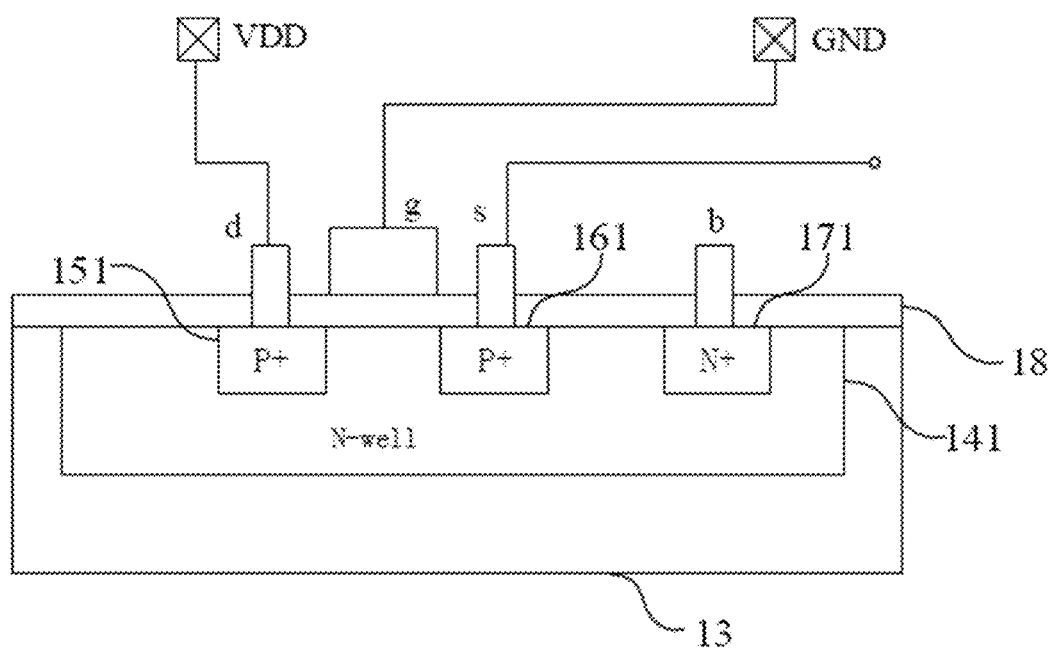

Referring to FIG. 2 and FIG. 3, FIG. 3 is a schematic structure diagram that the circuit diagram of the SOC of FIG. 2 corresponds to. The SOC 100 further includes a P-type substrate 13, an N-type well region 141, a first P-type source and drain region 151, a second P-type source and drain region 161, an N-type heavily doped region 171 and a first insulating layer 18.

The N-type well region 141 can be formed in the P-type substrate 13. The first P-type source and drain region 151 is formed in the N-type well region 141, and the second P-type source and drain region 161 is formed in the N-type well region 141. The N-type heavily doped region 171 is formed in the N-type well region 141. The first insulating layer 18 can be an oxide layer arranged on the P-type substrate 13.

The first insulating layer 18 is arranged with holes at places corresponding to the first P-type source and drain region 151, the second P-type source and drain region 161 and the N-type heavily doped region 171, so that the first source and drain d of the P-type transistor Q1 is arranged on the first P-type source and drain region 151 and directly contacts with the first P-type source and drain region 151; the second source and drain s of the P-type transistor Q1 is arranged on the second P-type source and drain region 161 and directly contacts with the second P-type source and drain region 161; the base b of the P-type transistor Q1 is arranged on the N-type heavily doped region 171 and connected to the N-type heavily doped region 171. The gate g of the P-type transistor Q1 can be arranged on the first insulating layer 18, and located between the first P-type source and drain region 151 and the second P-type source and drain region 161.

The first source and drain d of the P-type transistor Q1 is connected to the power supply pin VDD as the input terminal of the anti-reverse connection unit 12. The gate g of the P-type transistor Q1 is connected to the ground pin GND. The second source and drain s of the P-type transistor Q1 is connected to the anti-static unit 11 as the output terminal of the anti-reverse connection unit 12. The base b of the P-type transistor Q1 is floating connected.

Figure 4:
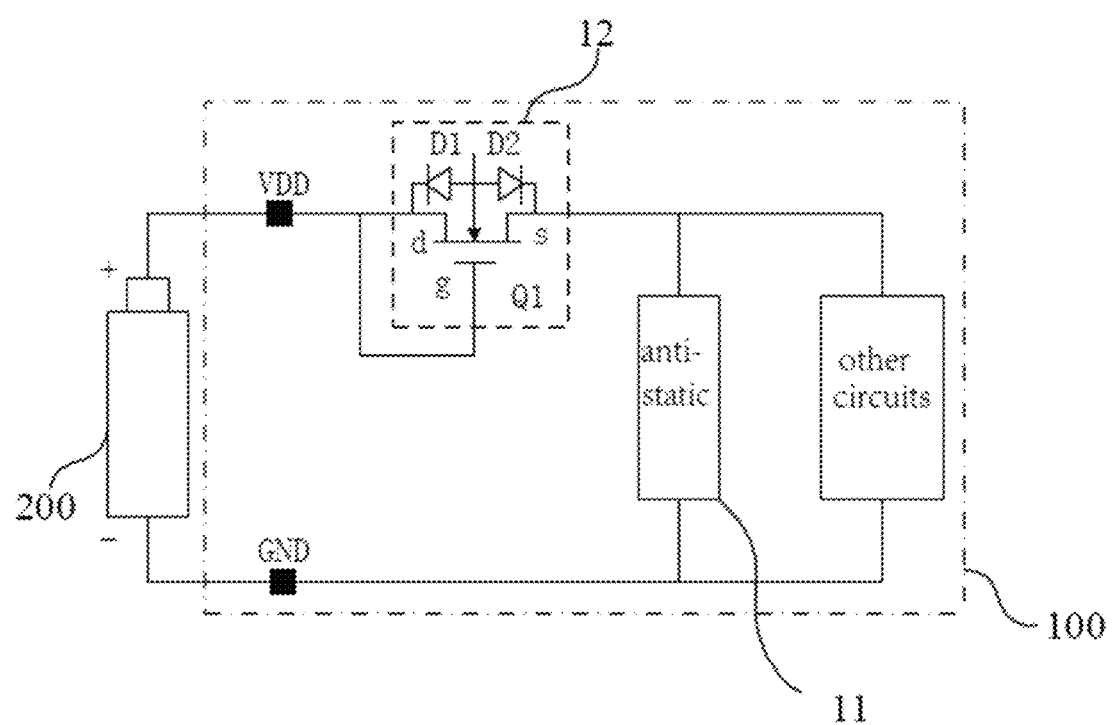
FIG. 4 is a schematic circuit diagram of another embodiment of the SOC of the present invention.

Please refer to FIG. 4, which is a schematic circuit diagram of another embodiment of the SOC of the present invention. The anti-reverse connection unit 12 may include a first field effect transistor Q1, which first field effect transistor Q1 can be an N-type transistor Q1. The N-type transistor Q1 may include a gate g, a first source and drain d, a second source and drain s, and a base b. Among them, the first source and drain d of the N-type transistor Q1 can be connected to the power supply pin VDD as the input terminal of the anti-reverse connection unit 12, the second source and drain s of the N-type transistor Q1 can be connected to the anti-static unit 11 as the output terminal of the anti-reverse connection unit 12, whereas the gate g of the N-type transistor Q1 can be connected to the power supply pin VDD, so as to conduct the N-type transistor Q1 when the SOC 100 is in normal operation.

The base b of the P-type transistor Q1 is floating connected, so that the PN junction is used to form a first diode D1 between the first source and drain d and the base b of the N-type transistor Q1, and to form a second diode D2 between the second source and drain s and the base b of the N-type transistor Q1, wherein the first diode D1 is arranged opposite to the second diode D2.

Specifically, the anode of the first diode D1 is the base b of the N-type transistor Q1 and the cathode of the first diode D1 is the first source and drain d of the N-type transistor Q1, the anode of the second diode D2 is base b of the N-type transistor Q1, and the cathode of the second diode D2 is the second source and drain s of the N-type transistor Q1.

When the external power supply 200 is reversely connected between the power supply pin VDD and the ground pin GND of the SOC 100, the N-type transistor Q1 cannot work normally, and the current can be cut off by the second diode D2, so as to prevent the external power supply 200 that is reversely connected from directly connecting the anode with the cathode of the external power supply 200 through the anti-static unit 11.

Figure 5:
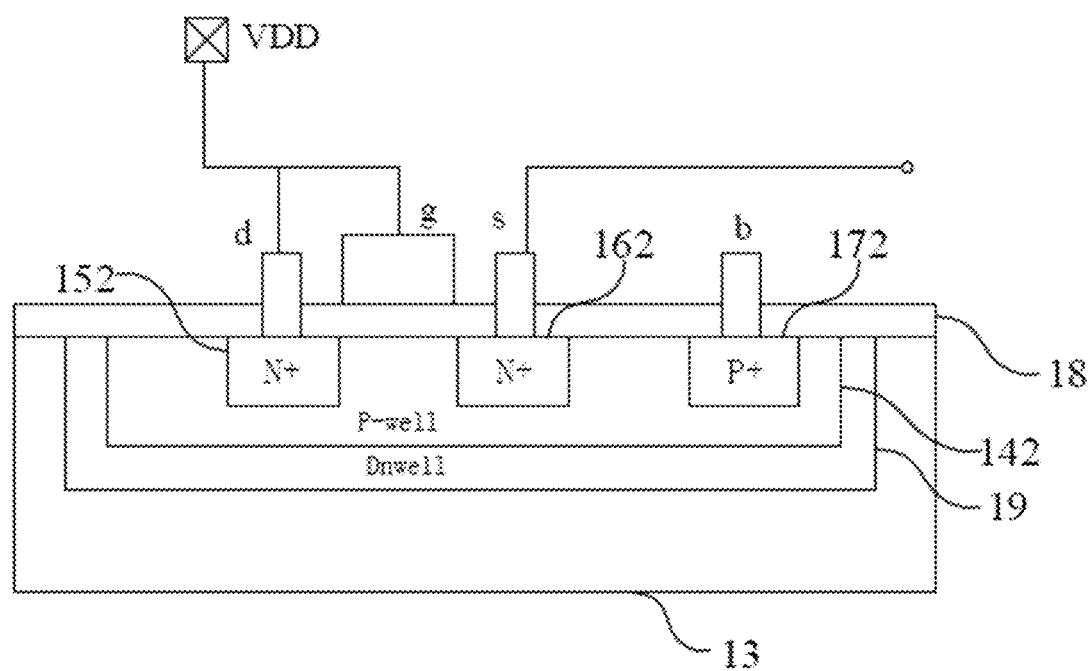

Referring to FIG. 4 and FIG. 5, FIG. 5 is a schematic structure diagram that the circuit diagram of the SOC of FIG. 4 corresponds to. The SOC 100 further includes a P-type substrate 13, a P-type well region 142, a first N-type source and drain region 152, a second N-type source and drain region 162, a P-type heavily doped region 172 and a first insulating layer 18 and an isolation region 19.

The isolation region 19 can be formed in the P-type substrate 13, and the P-type well region 142 can be formed in the isolation region 19. The first N-type source and drain region 152 can be formed in the P-type well region 142, and the second N-type source and drain region 162 can be formed in the P-type well region 142. The P-type heavily doped region 172 can be formed in the P-type well region 142. The first insulating layer 18 can be an oxide layer arranged on the P-type substrate 13.

The first insulating layer 18 is arranged with holes at places corresponding to the first N-type source and drain region 152, the second N-type source and drain region 162 and the P-type heavily doped region 172, so that the first source and drain d of the N-type transistor Q1 is arranged on the first N-type source and drain region 152 and directly contacts with the first N-type source and drain region 152; the second source and drain s of the N-type transistor Q1 is arranged on the second N-type source and drain region 162 and directly contacts with the second N-type source and drain region 162; the base b of the N-type transistor Q1 is arranged on the P-type heavily doped region 172 and connected to the P-type heavily doped region 172. The gate g of the N-type transistor Q1 can be arranged on the first insulating layer 18, and is located between the first N-type source and drain region 152 and the second N-type source and drain region 162.

The first source and drain d of the N-type transistor Q1 can serve as the input terminal of the anti-reverse connection unit 12, and be connected to the power supply pin VDD. The gate g of the N-type transistor can be connected to the power supply pin VDD. The second source and drain s of the N-type transistor Q1 can serve as the output terminal of the anti-reverse connection unit 12, and be connected to the anti-static unit 11. The base b of the N-type transistor Q1 can be floating connected.

Figure 6:
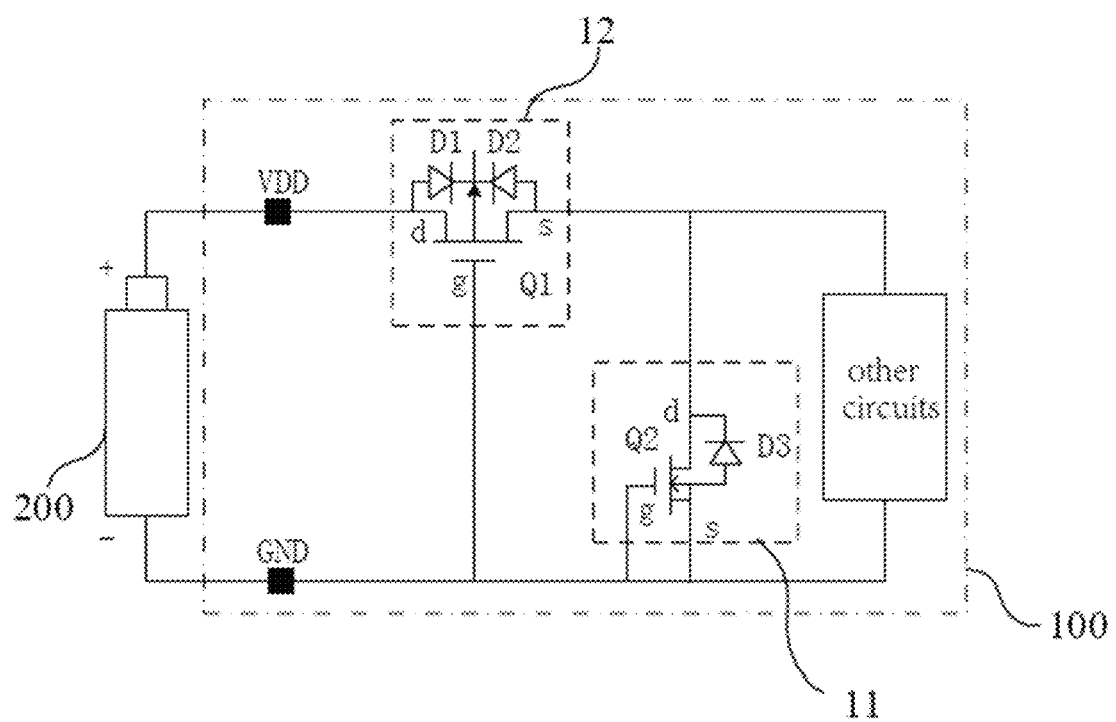
FIG. 6 is a schematic circuit diagram of another embodiment of the SOC of the present invention.

Please refer to FIG. 6. FIG. 6 is a schematic circuit diagram of another embodiment of the SOC of the present invention. The anti-static unit 11 may include a second N-type field effect transistor Q2. The second N-type field effect transistor Q2 may include a gate g, a first source and drain d, a second source and drain s and a base b.

Among them, the gate g and the second source and drain s of the second N-type field effect transistor Q2 are connected to the ground pin GND, the second source and drain s and the base b are connected, and first source and drain d is connected to the output terminal of the anti-static unit 12, the second N-type field effect transistor Q2, by use of the PN junction, forms a reversed third diode D3 between the first source and drain d and the base b.

When the power supply pin VDD of the SOC 100 receives the electrostatic voltage, the electrostatic voltage breaks down the reversed third diode D3 of the second N-type field effect transistor Q2 through the conducted anti-static unit 11, releasing the electrostatic voltage to the ground, and thus to perform ESD protection of the power supply pin VDD.

Figure 7:
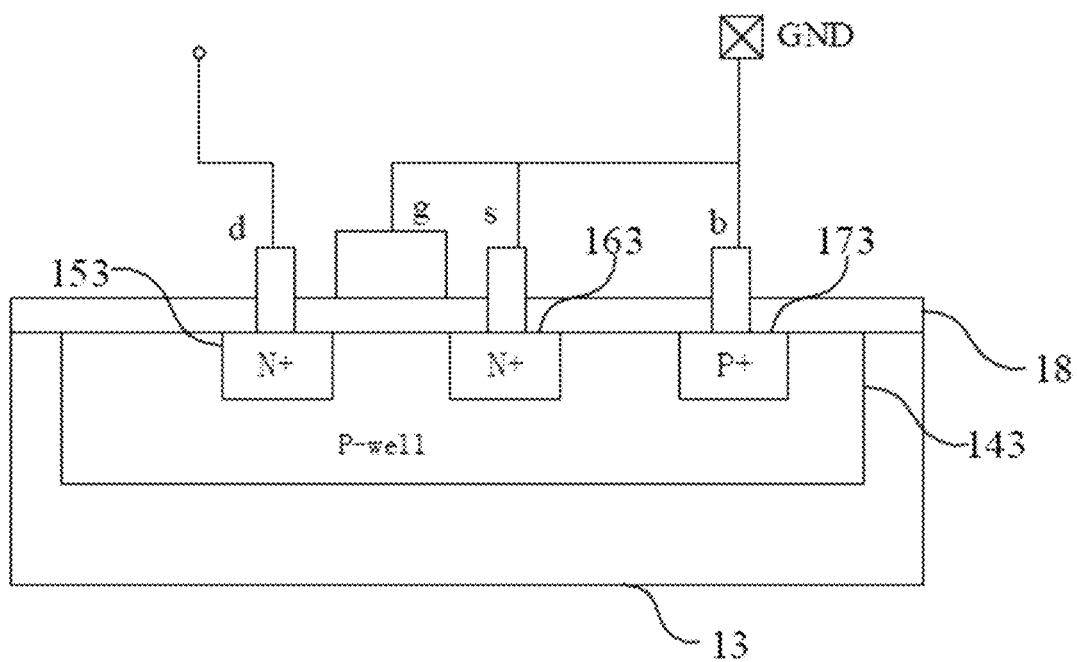

In combination with FIG. 6 and FIG. 7, FIG. 7 is the schematic structure diagram that the SOC of FIG. 6 corresponds to. The SOC includes a P-type substrate 13, a P-type well region 143, a first N-type source and drain region 153, a second N-type source and drain region 163, a P-type heavily doped region 173 and a first insulating layer 18.

The P-type well region 143 can be formed in the P-type substrate 13. The first N-type source and drain region 153 can be formed in the P-type well region, and the second N-type source and drain region 163 can be formed in the P-type well region 143. The P-type heavily doped region 173 can be formed in the P-type well region 143. The first insulating layer 18 can be an oxide layer arranged on the P-type substrate 13.

The first insulating layer 18 is arranged with holes at places corresponding to the first N-type source and drain region 153, the second N-type source and drain region 163 and the P-type heavily doped region 173, so that the first source and drain d of the second N-type field effect transistor Q2 is arranged on the first N-type source and drain region 153 and directly contacts with the first N-type source and drain region 153; the second source and drain s of the second N-type field effect transistor Q2 is arranged on the second N-type source and drain region 163 and directly contacts with the second N-type source and drain region 163; the base b of the second N-type field effect transistor Q2 is arranged on the P-type heavily doped region 173 and connected to the P-type heavily doped region 173. The gate g of the second N-type field effect transistor Q2 can be arranged on the first insulating layer 18, and is located between the first N-type source and drain region 153 and the second N-type source and drain region 163.

The first source and drain d of the second N-type field effect transistor Q2 serves as the output terminal of the anti-static unit 11 and is connected to the output terminal of the anti-reverse connection unit 12. The gate g, the second source and drain s and the base b of the second N-type field effect transistor Q2 can respectively be connected to the ground pin.

Figure 8:
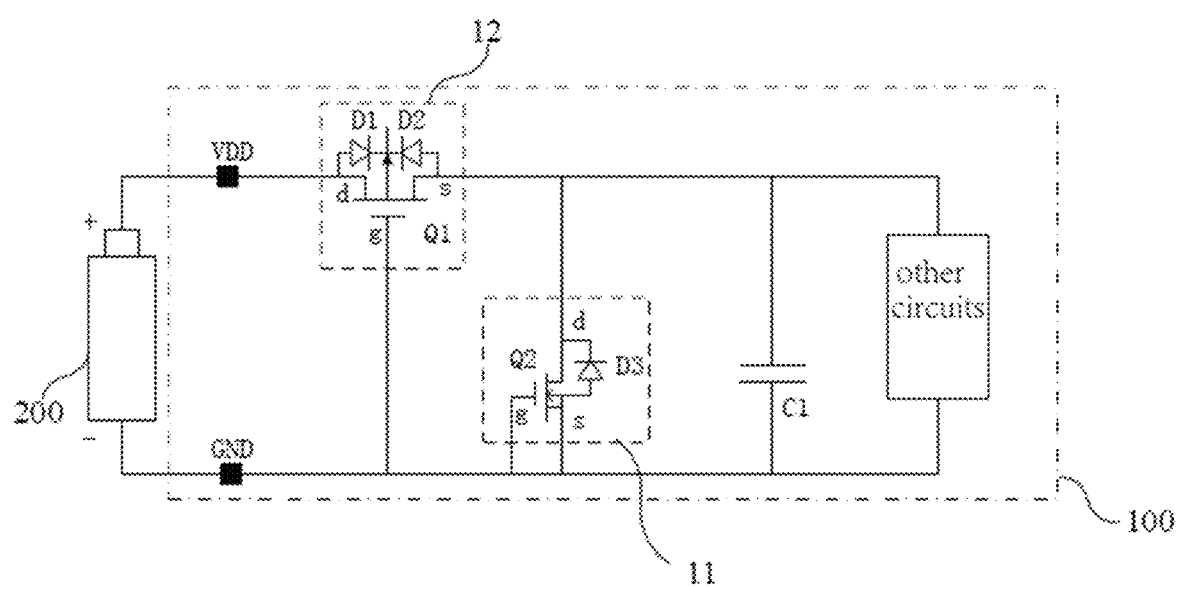
FIG. 8 is a schematic circuit diagram of another embodiment of the SOC of the present invention.
Figure 9:
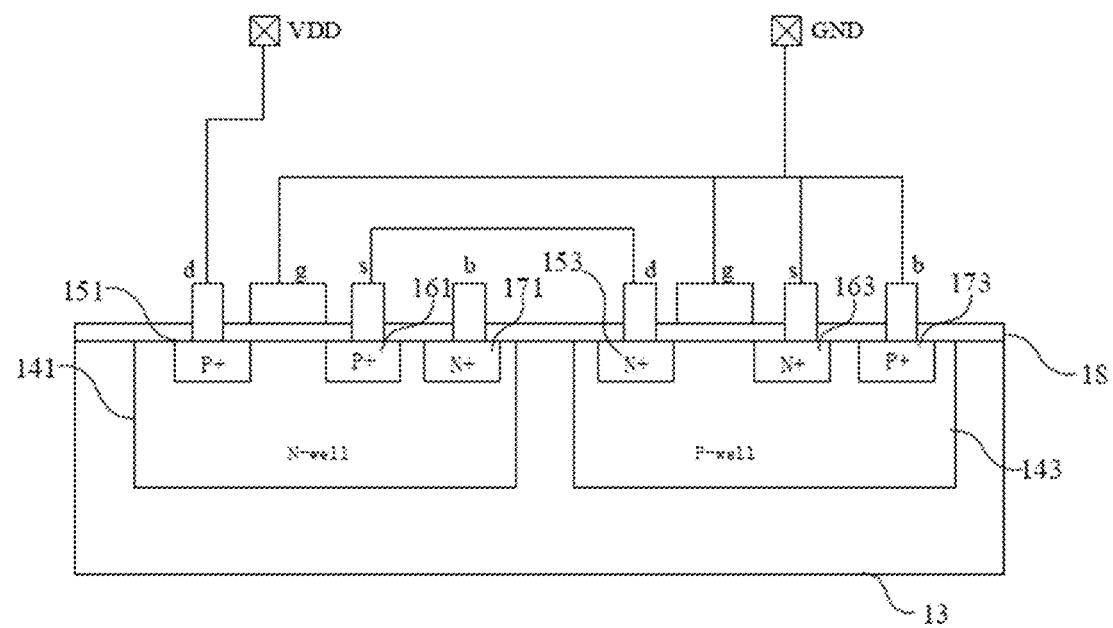

When no conflict arises, the above embodiments can be freely combined. For example, please refer to FIG. 8 and FIG. 9. FIG. 8 is the schematic circuit diagram of another embodiment of the SOC of the present invention, and FIG. 9 is the structure diagram that the SOC of FIG. 8 corresponds to. The anti-static unit 11 in this embodiment may include a second N-type transistor Q2, and the anti-reverse connection unit 12 may include a P-type transistor Q1.

The SOC 100 may include a P-type substrate 13 and an N-type well region 141 and a P-type well region 143 formed within the P-type substrate 13. The N-type well region 141 includes a first P-type source and drain region 151, a second P-type source and drain region 161, and an N-type heavily doped region 171. The P-type well region 143 includes a first N-type source and drain region 153, a second N-type source and drain region 163, and a P-type heavily doped region 173.

The first insulating layer 18 is arranged on the P-type substrate 13, and the first insulating layer 18 is arranged with holes at places corresponding to the first P-type source and drain region 151, the second P-type source and drain region 161, the N-type heavily doped region 171, the first N-type source and drain region 153, the second N-type source and drain region 163 and the P-type heavily doped region 173.

The first source and drain d of the P-type transistor Q1 is arranged on the first P-type source and drain region 151 and directly contacts with the first P-type source and drain region 151; the second source and drain s of the P-type transistor Q1 is arranged on the second P-type source and drain region 161 and directly contacts with the second P-type source and drain region 161; the base b of the P-type transistor Q1 is arranged on the N-type heavily doped region 171 and is connected to the N-type heavy doped region 171. The gate g of the P-type transistor Q1 can be arranged on the first insulating layer 18, and is located between the first P-type source and drain region 151 and the second P-type source and drain region 161.

The first source and drain d of the second N-type transistor Q2 is arranged on the first N-type source and drain region 153 and directly contacts with the first N-type source and drain region 153; the second source and drain s of the second N-type field effect transistor Q2 is arranged on the second N-type source and drain region 163 and directly contacts with the second N-type source and drain region 163; the base b of the second N-type field effect transistor Q2 is arranged on the P-type heavily doped region 173 and connected to the P-type heavily doped region 173. The gate g of the second N-type field effect transistor Q2 can be arranged on the first insulating layer 18, and is located between the first N-type source and drain region 153 and the second N-type source and drain region 163.

The first source and drain d of the P-type transistor Q1 is connected to the power supply pin VDD, the second source and drain s of the P-type transistor Q1 is connected to the first source and drain d of the second N-type field effect transistor Q2, the base b of the P-type transistor Q1 is floating connected, the gate g of the P-type transistor Q1 and the gate g, the second source and drain s and the base b of the second N-type field effect transistor Q2 are respectively connected to the ground pin GND.

In other embodiments, the SOC may also include an anti-reverse connection unit of an N-type transistor and an anti-static unit of a second N-type field effect transistor, which will not be further described here.

Figure 10:
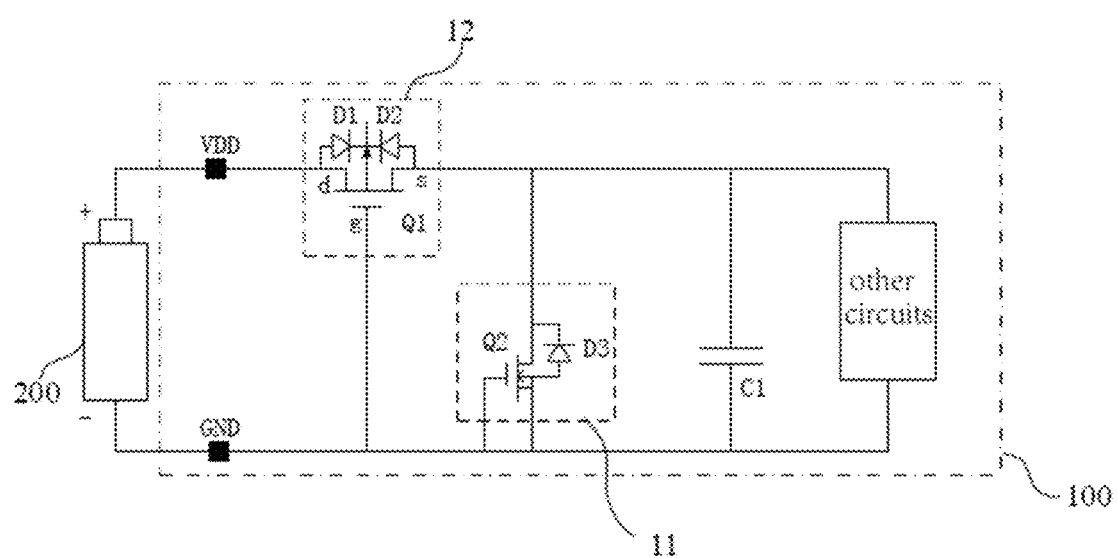
FIG. 10 is a schematic circuit diagram of another embodiment of the SOC of the present invention.

Please refer to FIG. 10, which is the schematic circuit diagram of another embodiment of the SOC of the present invention. The SOC 100 may further include a filter capacitor C1, wherein one end is connected to the output terminal of the anti-reverse connection unit 12, and the other end is connected to the ground pin GND. The filter capacitor C1 can stabilize the circuit voltage and ensure the normal operation of the SOC 100. For example, when the internal resistance of the battery causes the battery voltage to be too low for a moment, and lower than the working voltage of the SOC 100, the filter capacitor C1 can provide voltage for the SOC 100 to maintain the normal operation of the SOC 100.

It is to be understood that the specific embodiments described herein are only used to explain the present invention, rather than to limit the present invention. Further, to simplify the description, partial but not the whole structures related to the present invention are shown in the drawings. All the other embodiments obtained by persons skilled in the art without creative effort based on the embodiments of the present invention fall within the protection scope of the present invention.

The terms "first", "second" and the like in the present invention are used to distinguish different objects, rather than to describe a specific order. In addition, the terms "include" and "have" and any deformation of them are intended to cover non-exclusive inclusions. For example, a process, a method, a system, a product or a device that includes a series of steps or units is not limited to the listed steps or units, but also optionally includes the steps or units that are not listed, or optionally includes other inherent steps or units for such processes, methods, products or devices.

"Embodiments" as mentioned in the present invention means that specific features, structures or characteristics as described in combination with the embodiments may be included in at least one embodiment of the present invention. The phrase presenting at various places in the specification does not necessarily refer to the same embodiment, nor is it an independent or alternative embodiment mutually exclusive with other embodiments. It is explicitly and implicitly understood by those skilled in the art that the embodiments described herein may be combined with other embodiments.

The above are only ways to implement the present invention, and do not limit the scope of the present invention. Any change of equivalent structures or equivalent processes made by using the contents of the specification and the attached drawings of the present invention, or direct or indirect application in other related technical fields, are similarly included in the protection scope of the present invention.

The invention claimed is:

1. A System on Chip comprising: a power supply pin, a ground pin, an anti-static unit and an anti-reverse connection unit, wherein the anti-static unit is connected between the power supply pin and the ground pin through the anti-reverse connection unit, and the power supply pin and the ground pin of the System on Chip are connected to an external power supply;

wherein when the System on Chip is in normal operation, the anti-static unit performs ESD protection of the power supply pin through the conducted anti-static unit; whereas when the external power supply is reversely connected between the power supply pin and the ground pin of the System on Chip, the anti-reverse connection unit is cut off to prevent the reversely connected external power supply from directly connecting anode with cathode of the external power supply through the anti-static unit;

wherein the anti-reverse connection unit includes:

a first field effect transistor which includes a gate, a first source and drain, a second source and drain, and a base, wherein the first source and drain of the first field effect transistor is connected to the power supply pin as input terminal of the anti-reverse connection unit, and the second source and drain of the first field effect transistor is connected to the anti-static unit as output terminal of the anti-reverse connection unit, and the gate of the first field effect transistor is selectively connected to the power supply pin or the ground pin to conduct the first field effect transistor when the System on Chip is in normal operation;

wherein the base of the first field effect transistor is floating connected, so that PN junction is used to form a first diode between the first source and drain and the base of the first field effect transistor, and to form a second diode between the second source and drain and the base of the first field effect transistor, the first diode being opposite to the second diode, so that the anti-reverse connection unit is cut off to prevent the external power supply that is reversely connected from directly connecting anode with cathode of the external power supply through the anti-static unit when the external power supply is reversely connected between the power supply pin and the ground pin of the System on Chip.

2. The System on Chip according to claim 1, wherein the first field effect transistor is a P-type transistor, wherein the gate of the P-type transistor is connected to the ground pin to conduct the P-type transistor when the System on Chip is in normal operation;
and the anode of the first diode is the first source and drain of the P-type transistor, the cathode of the first diode is the base of the P-type transistor; the anode of the second diode is the second source and drain of the P-type transistor, and the cathode of the second diode is the base of the P-type transistor.

3. The System on Chip according to claim 2, wherein the System on Chip further includes:
a P-type substrate;
an N-type well region formed in the P-type substrate;
a first P-type source and drain region formed in the N-type well region;
a second P-type source and drain region formed in the N-type well region;
an N-type heavily doped region formed in the N-type well region;
a first insulating layer arranged on the substrate;
wherein, the first source and drain is arranged on the first P-type source and drain region, the second source and drain is arranged on the second P-type source and drain region, the gate is arranged on the insulating layer and between the first P-type source and drain region and the second P-type source and drain region, and the base is arranged on the N-type heavily doped region;
the first source and drain, serving as input terminal of the anti-reverse connection unit, is connected to the power supply pin; the gate is connected to the ground pin; and the second source and drain, serving as output terminal of the anti-reverse connection unit, is connected to the anti-static unit.

4. The System on Chip according to claim 1, wherein the first field effect transistor is an N-type transistor, wherein the gate of the N-type transistor is connected to the power supply pin to conduct the N-type transistor when the System on Chip is in normal operation;
and the anode of the first diode is the base of the N-type transistor; the cathode of the first diode is the first source and drain of the N-type transistor; the anode of the second diode is the base of the N-type transistor, and the cathode of the second diode is the second source and drain of the N-type transistor.

5. The System on Chip according to claim 4, wherein the System on Chip further includes:
a P-type substrate;
a P-type well region formed in the P-type substrate;
a first N-type source and drain region formed in the P-type well region;
a second N-type source and drain region formed in the P-type well region;
a P-type heavily doped region formed in the P-type well region;
a first insulating layer arranged on the substrate;
wherein, the first source and drain is arranged on the first N-type source and drain region, the second source and drain is arranged on the second N-type source and drain region, whereas the gate is arranged on the insulating layer and between the first N-type source and drain region and the second N-type source and drain region, and the base is arranged on the P-type heavily doped region;
the first source and drain, serving as input terminal of the anti-reverse connection unit, is connected to the power supply pin; the gate is connected to the power supply pin;
whereas the second source and drain, serving as output terminal of the anti-reverse connection unit, is connected to the anti-static unit.

6. The System on Chip according to claim 1, wherein the anti-static unit includes:
a second N-type field effect transistor which includes a gate, a first source and drain, a second source and drain and a base, wherein the gate and the second source and drain of the second N-type field effect transistor are connected to the ground pin, the second source and drain and the base are connected, the first source and drain is connected to the output terminal of the anti-static unit and, by use of PN junction, the second N-type field effect transistor forms a reversed third diode between the first source and drain and the base;
wherein, when the power supply pin of the System on Chip receives electrostatic voltage, the electrostatic voltage breaks down the reversed third diode of the second N-type transistor through the conducted anti-static unit, so as to perform ESD protection of the power supply pin.

7. The System on Chip according to claim 6, wherein the System on Chip further includes:
a P-type substrate;
a P-type well region formed in the P-type substrate;
a first N-type source and drain region formed in the P-type well region;
a second N-type source and drain region formed in the P-type well region;
a P-type heavily doped region formed in the P-type well region;
a first insulating layer arranged on the substrate;
wherein, the first source and drain of the second N-type field effect transistor is arranged on the first N-type source and drain region to serve as the input terminal of the anti-static unit to be connected to the output terminal of the anti-reverse connection unit, and the second source and drain of the second N-type field effect transistor is arranged on the second N-type source and drain region; the gate of the second N-type field effect transistor is arranged on the first insulating layer and located between the first N-type source and drain region and the second N-type source and drain region, and the base of the second N-type field effect transistor is arranged on the P-type heavily doped region;
wherein, the gate, the second source and drain and the base of the second N-type field effect transistor are respectively connected to the ground pin.

8. The System on Chip according to claim 1, wherein it further includes:
a filter capacitor, wherein its one end is connected to the output terminal of the anti-reverse connection unit, and the other end is connected to the ground pin.

9. The System on Chip according to claim 1, wherein the external power supply is a battery.

* * * * *